(12) United States Patent
Ng et al.

(10) Patent No.: US 8,188,814 B2
(45) Date of Patent: May 29, 2012

(54) HIGH VOLTAGE ISOLATION DUAL CAPACITOR COMMUNICATION SYSTEM

(75) Inventors: Gek Yong Ng, Singapore (SG); Kah Weng Lee, Singapore (SG); Fun Kok Chow, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 492 days.

(21) Appl. No.: 12/397,254

(22) Filed: Mar. 3, 2009

(65) Prior Publication Data
US 2009/0206960 A1 Aug. 20, 2009

Related U.S. Application Data

(63) Continuation-in-part of application No. 12/032,165, filed on Feb. 15, 2008, now Pat. No. 7,741,935.

(51) Int. Cl.
*H01P 1/00* (2006.01)
(52) U.S. Cl. .................................................. 333/247
(58) Field of Classification Search .................... 333/247
See application file for complete search history.

(56) References Cited

U.S. PATENT DOCUMENTS

| | | | |
|---|---|---|---|
| 4,799,092 A | 1/1989 | Klaassen | |
| 4,989,127 A | 1/1991 | Wegener | |
| 5,530,277 A | 6/1996 | Otsuki et al. | |
| 5,561,393 A | 10/1996 | Sakurai et al. | |
| 5,625,265 A | 4/1997 | Vlahu | |
| 5,693,871 A | 12/1997 | Stout et al. | |
| 5,693,971 A | 12/1997 | Gonzalez | |
| 5,945,728 A | 8/1999 | Dobkin et al. | |
| 6,137,827 A | 10/2000 | Scott | |
| 6,167,475 A | 12/2000 | Carr | |
| 6,215,377 B1 | 4/2001 | Douriet et al. | |
| 6,320,532 B1 | 11/2001 | Diede | |
| 6,489,850 B2 | 12/2002 | Heineke et al. | |
| 6,538,313 B1 | 3/2003 | Smith | |
| 6,563,211 B2 | 5/2003 | Fukada et al. | |
| 6,574,091 B2 | 6/2003 | Heineke et al. | |
| 6,583,681 B1 | 6/2003 | Makino et al. | |
| 6,583,976 B1 * | 6/2003 | Murahashi et al. | 361/100 |
| 6,661,079 B1 * | 12/2003 | Bikulcius | 257/532 |
| 6,944,009 B2 | 9/2005 | Nguyen et al. | |

(Continued)

FOREIGN PATENT DOCUMENTS

JP 2003-339168 11/2003

(Continued)

OTHER PUBLICATIONS

"ACCL-9xxx 3.3V/5V High Speed CMOS Capacitive Isolator", *Preliminary Datasheet*, Avago Technologies, Nov. 9, 2007.

(Continued)

*Primary Examiner* — Adolf Berhane
*Assistant Examiner* — Yemane Mehari

(57) ABSTRACT

According to one embodiment, there is provided a high voltage isolation dual capacitor communication system comprising communication drive and sense electrodes and corresponding first and second capacitors that are formed in two separate devices. The two devices are electrically connected in series to provide a single galvanically-isolated communication system that exhibits high breakdown voltage performance in combination with good signal coupling. The system effects communications between drive and receive circuits through the first and second capacitors, and in a preferred embodiment is capable of effecting relatively high-speed digital communications. The system may be formed in a small package using, by way of example, CMOS or other semiconductor fabrication and packaging processes.

30 Claims, 8 Drawing Sheets

U.S. PATENT DOCUMENTS

| | | |
|---|---|---|
| 6,960,945 B1 | 11/2005 | Bonin |
| 7,016,490 B2 | 3/2006 | Beutler et al. |
| 7,170,807 B2 | 1/2007 | Franzen et al. |
| 7,331,723 B2 | 2/2008 | Yoon et al. |
| 7,379,037 B2 | 5/2008 | Takeuchi et al. |
| 7,394,337 B2 | 7/2008 | Arai et al. |
| 7,741,896 B2 * | 6/2010 | Chow et al. .................. 327/427 |
| 7,741,935 B2 * | 6/2010 | Chow et al. .................. 333/247 |
| 2006/0095639 A1 | 5/2006 | Guenin et al. |
| 2007/0008679 A1 | 1/2007 | Takahasi et al. |
| 2007/0025123 A1 | 2/2007 | Kim et al. |
| 2007/0133933 A1 | 6/2007 | Yoon et al. |
| 2007/0162645 A1 | 7/2007 | Han et al. |
| 2008/0179963 A1 | 7/2008 | Fouquet et al. |

FOREIGN PATENT DOCUMENTS

| | | |
|---|---|---|
| JP | 2003339168 | * 11/2003 |
| WO | WO-2005/001928 | 6/2005 |

OTHER PUBLICATIONS

"Texas Instruments Dual Digital Isolators", *SLLS755E* Jul. 2007.

U.S. Appl. No. 11/264,956, filed Nov. 1, 2005, Guenin et al.

* cited by examiner

HIGH VOLTAGE ISOLATION DUAL CAPACITOR COMMUNICATION SYSTEM

RELATED APPLICATION

This application claims priority and other benefits from, and is a continuation-in-part of, U.S. patent application Ser. No. 12/032,165 filed Feb. 15, 2008 entitled "High Voltage Isolation Semiconductor Capacitor Digital Communication Device and Corresponding Package," to Chow et al. (hereafter "the '165 patent application"), the entirety of which is hereby incorporated by reference herein.

FIELD OF THE INVENTION

Various embodiments of the invention described herein relate to the field of digital communications, and more specifically to devices employing capacitively-coupled means to transmit and receive digital communication data at relatively high speeds in a small package exhibiting high breakdown voltage characteristics. The components, devices, systems and methods described herein find particularly efficacious use in high-speed communication applications requiring high voltage isolation.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required. Prior art magnetic devices typically achieve high voltage isolation by employing opposing inductively-coupled coils, also usually require high power levels (especially when high data rates required), typically require the use of at least three separate integrated circuits or chips, and are susceptible to electromagnetic interference ("EMI"). Prior art capacitive devices typically achieve high voltage isolation by employing multiple pairs of transmitting and receiving electrodes, where for example a first pair of electrodes is employed to transmit and receive data, and a second pair of electrodes is employed to refresh or maintain the transmitted signals.

What is needed is a high voltage isolation communication device that is small, consumes reduced power, permits data to be communicated at relatively high data rates, has improved high voltage breakdown capabilities, and that may be built at lower cost.

SUMMARY

In some embodiments, there is provided a high voltage isolation dual capacitor communication system comprising a transmitter having a first capacitor comprising at least first and second communication drive electrodes separated by a distance $d_{tx}$ and disposed in at least a first electrically conductive metallized layer, the first and second drive electrodes having a first capacitance $C_{tx}$ therebetween, a first electrically conductive ground plane being spaced vertically apart from the first and second drive electrodes by a first electrically insulative layer, the first drive electrode being operably coupled to a drive input through a first node, a drive circuit being operably coupled to the drive input and configured to transmit a communication drive signal through the first capacitor, a receiver having a second capacitor comprising at least first and second communication sense electrodes separated by a distance $d_{rx}$ and disposed in at least a second electrically conductive metallized layer, the first and second sense electrodes having a second capacitance $C_{rx}$ therebetween, a second electrically conductive ground plane being spaced vertically apart from the first and second sense electrodes by a second electrically insulative layer, the second sense electrode being operably coupled to a sense output through a second node, a receive circuit being operably coupled to the sense output and configured to receive the communication drive signal received by the second capacitor, wherein the first and second capacitors of the transmitter and receiver, respectively, are connected electrically in series to permit the transfer of the communication drive signal through an electrical connection disposed therebetween, the first and second capacitors are configured to provide galvanic isolation between the transmitter and the receiver, a high voltage isolation distance of the system is defined by a sum of the distances $d_{tx}$ and $d_{rx}$, and a voltage developed between the first node and the second node is shared and distributed between the first and second capacitors.

In other embodiments, there is provided a method of making a high voltage isolation dual capacitor communication system, comprising providing a transmitter having a first capacitor comprising at least first and second communication drive electrodes separated by a distance $d_{tx}$ and disposed in at least a first electrically conductive metallized layer, the first and second drive electrodes having a first capacitance $C_{tx}$ therebetween, a first electrically conductive ground plane being spaced vertically apart from the first and second drive electrodes by a first electrically insulative layer, the first drive electrode being operably coupled to a drive input through a first node, a drive circuit being operably coupled to the drive input and configured to transmit a communication drive signal through the first capacitor, and providing a receiver having a second capacitor comprising at least first and second communication sense electrodes separated by a distance $d_{rx}$ and disposed in at least a second electrically conductive metallized layer, the first and second sense electrodes having a second capacitance $C_{rx}$ therebetween, a second electrically conductive ground plane being spaced vertically apart from the first and second sense electrodes by a second electrically insulative layer, the second sense electrode being operably coupled to a sense output through a second node, a receive circuit being operably coupled to the sense output and configured to receive the communication drive signal received by the second capacitor, wherein the first and second capacitors of the transmitter and receiver, respectively, are connected electrically in series to permit the transfer of the communication drive signal through an electrical connection disposed therebetween, the first and second capacitors are configured to provide galvanic isolation between the transmitter and the receiver, a high voltage isolation distance of the system is defined by a sum of the distances $d_{tx}$ and $dr_x$, and a voltage developed between the first node and the second node is shared and distributed between the first and second capacitors.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTION OF SOME PREFERRED EMBODIMENTS

In the various embodiments of the invention, a dual capacitor communication system is provided.

On-chip high voltage isolation may be provided in communication devices by using vertically stacked capacitor structures that are capable of achieving high signal coupling efficiency at the expense of lower high voltage breakdown performance. On the other hand, co-planar horizontal capacitor structures employed in such devices have certain advantages compared to stacked vertical capacitor structures, including offering a better trade-off between signal coupling efficiency and high voltage breakdown performance. By using a combined hybrid structure comprising a first capacitor in a transmitter connected electrically in series with a second capacitor in a receiver, signal coupling efficiency and high voltage breakdown performance can be optimized at the same time. In one embodiment, the first and second capacitors are implemented on separate IC dice using suitable circuitry capable of providing the requisite degree of galvanic isolation for such a hybrid structure. In an especially preferred embodiment, the first capacitor comprises vertically stacked drive electrodes and the second capacitor comprises co-planar sense electrodes that are disposed in a single horizontal plane, more about which is said below.

Figure 1:
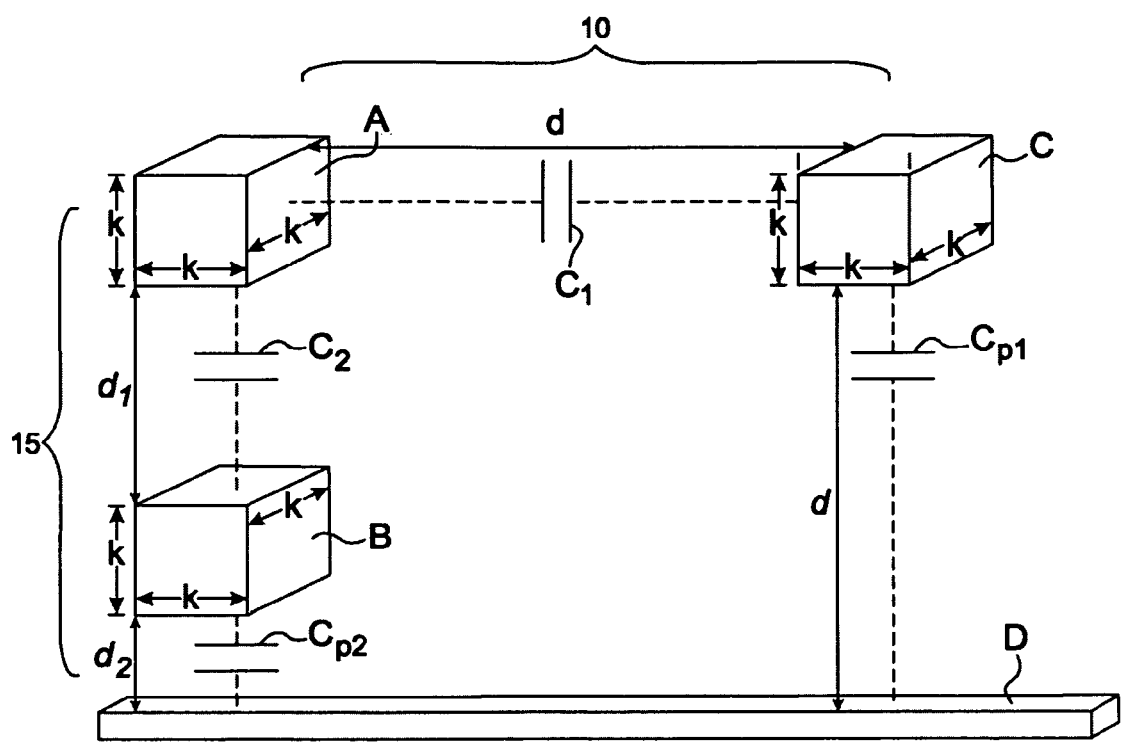
FIG. 1 shows horizontal and vertical capacitor structures.

Referring now to FIG. 1, there are shown co-planar horizontal and stacked vertical capacitor structures 10 and 15, respectively. Co-planar horizontal capacitor structure 10 comprises electrodes A and C separated by distance d and characterized by capacitance $C_1$ therebetween, and electrode C and ground plane substrate D separated by distance d and characterized by parasitic capacitance $C_{p1}$. Vertical capacitor structure 15 comprises electrodes A and B separated by distance $d_1$ and characterized by capacitance $C_2$ therebetween, and electrode B and ground plane substrate D separated by distance $d_2$ and characterized by parasitic capacitance $C_{p2}$. As shown in FIG. 1, electrodes A, B and C have widths, heights and lengths all equaling k, which simplifies the derivation of equations 1 through 6 set forth below. Electrodes A and C are formed in an upper metal layer in horizontal capacitor structure 10, and electrode B is formed in a lower metal layer in vertical capacitor structure 15. In horizontal and vertical capacitor structures 10 and 15 illustrated in FIG. 1, it is assumed that capacitance arises from the surface areas presented by electrodes A, B and C only, and that fringe capacitance is zero.

In accordance with the foregoing assumptions, capacitances $C_1$ and $C_2$, parasitic capacitances $C_{p1}$ and $C_{p2}$, coupling efficiencies $C_{1\mathit{eff}}$ and $C_{2\mathit{eff}}$ may be calculated as follows:

$$C_1 = \in k^2/d \qquad \text{eq. (1),}$$

$$C_{p1} = \in k^2/d \qquad \text{eq. (2),}$$

$$C_{1\mathit{eff}} = C_1/(C_1 + C_{p1}) = \tfrac{1}{2} \qquad \text{eq. (3),}$$

$$C_2 = \in k^2/d_1 \qquad \text{eq. (4),}$$

$$C_{p2} = \in k^2/d_2 \qquad \text{eq. (5), and}$$

$$C_{2\mathit{eff}} = C_2/(C_2 + C_{p2}) = d_2/(d_1 + d_2) \qquad \text{eq. (6),}$$

where $\in$ = the permittivity of a dielectric material disposed between electrodes A, B and C, and between such electrodes and substrate D. Note that in capacitor structures 10 and 15 illustrated in FIG. 1, electrode A is a drive electrode, and electrodes B and C are sense electrodes.

Referring to equation 6 above, it will be seen that: if $d_1 = d_2$, then $C_{2\mathit{eff}} = \tfrac{1}{2}$, which is the same coupling efficiency provided by $C_{1\mathit{eff}}$. However, the breakdown voltage between electrode A and electrode B for $C_{2\mathit{eff}}$ is lower than the breakdown voltage between electrode A and electrode C for $C_{1\mathit{eff}}$ since $d_1$ is less than d.

Continuing to refer to equation 6 above, it will be seen that if $d_1 < d_2$, then $C_{2\mathit{eff}} > \tfrac{1}{2}$, which is an even greater coupling efficiency provided by $C_{1\mathit{eff}}$. However, the breakdown voltage between electrode A and electrode B for $C_{2\mathit{eff}}$ in this case is now even lower than the breakdown voltage between electrode A and electrode C for $C_{1\mathit{eff}}$ since $d_1$ is much less than d.

Still referring to equation 6 above, it will be seen that if $d_1 > d_2$, then $C_{2\mathit{eff}} < \tfrac{1}{2}$, which is lower than the coupling efficiency provided by $C_{1\mathit{eff}}$. While the breakdown voltage between electrode A and electrode B for $C_{2\mathit{eff}}$ is better than in the two cases described above, it is still lower than the breakdown voltage between electrode A and electrode C for $C_{1\mathit{eff}}$, since $d_1$ is less than d.

The above calculations illustrate that in a capacitor design for a high voltage isolation semiconductor digital communication device various tradeoffs must be made between coupling efficiency, parasitic capacitance, breakdown voltage, geometry and other factors. To that end, it has been discovered that horizontal capacitor structure 10 illustrated in FIG. 1, in comparison to vertical capacitor structure 15 of FIG. 1 provides the best overall performance characteristics in a device where high voltage isolation, high breakdown voltages and good coupling efficiencies are required. Moreover, in horizontal capacitor structure 10 of FIG. 1, if the thickness of electrodes A and C in the top metal layer of horizontal capacitor structure 10 is increased, coupling efficiency $C_{1\mathit{eff}}$ increases because as capacitance $C_1$ increases in response to the thickness of electrodes A and C being increased parasitic capacitance $C_{p1}$ remains constant. As shown in FIG. 1, electrodes A and C are disposed in the same horizontal plane, and thus the breakdown voltage between electrodes A and C, or between electrode A and ground plane substrate D, is always greater than the breakdown voltage between electrode A and electrode B. Thus, in one embodiment of the high voltage isolation semiconductor communication device of the invention, where co-planar sense and drive electrodes are disposed in a single horizontally-oriented plane, coupling efficiency is improved while maintaining a high breakdown voltage. Such high coupling efficiency translates directly into improved circuit performance, smaller package or chip area, lower power consumption, and faster data transmission rates.

Referring now to FIGS. 2 through 6, there are shown various embodiments of high voltage isolation dual capacitor communication system 10, all of which embodiments have the following components and features in common: Transmitter 20 is provided having a first capacitor 22 comprising at least first and second communication drive electrodes 21 and 23 separated by a distance $d_{tx}$ and disposed in at least a first electrically conductive metallized layer 24. The first and second drive electrodes 21 and 23 have a first capacitance $C_{tx}$ therebetween, and a first electrically conductive ground plane 29 is spaced vertically apart from the first and second drive electrodes by a first electrically insulative layer 25. The first drive electrode is operably coupled to a drive input 26 through a first node 27, where a drive circuit 28 is operably coupled to the drive input 26 and configured to transmit a communication drive signal through the first capacitor 22.

A receiver 40 has a second capacitor 42 comprising at least first and second communication sense electrodes 41 and 43 separated by a distance $d_{rx}$ and disposed in at least a second electrically conductive metallized layer 44. The first and second sense electrodes 41 and 43 have a second capacitance $C_{rx}$ therebetween, and a second electrically conductive ground plane 49 is spaced vertically apart from the first and second sense electrodes 41 and 43 by a second electrically insulative layer 45. The second sense electrode 43 is operably coupled to a sense output 46 through a second node 47. A receive circuit 48 is operably coupled to the sense output 46 and configured to receive the communication drive signal received by the second capacitor 42.

The first and second capacitors 22 and 42 of the transmitter 20 and the receiver 40, respectively, are connected electrically in series to permit the transfer of the communication drive signal through an electrical connection 30 disposed therebetween. The first and second capacitors 22 and 42 are configured to provide galvanic isolation between the transmitter 20 and the receiver 40, and a high voltage isolation distance of the system is defined by a sum of the distances $d_{tx}$ and $d_{rx}$. A voltage developed between the first node 27 and the second node 47 is shared and distributed between the first and second capacitors 22 and 42.

The above discussion and analysis respecting the capacitor structures shown in FIG. 1 reveals that high voltage breakdown performance in a high voltage capacitive isolator is determined in part by the distance d, which is a fixed parameter for a given manufacturing process. To overcome this physical limitation, and to further increase the high voltage breakdown level of an isolation capacitor, the various embodiments presented herein offer unique arrangements of dual capacitors to implement on-chip high voltage isolation by employing series connections of a first capacitor in a transmitter and a second capacitor in a receiver.

Figure 2:
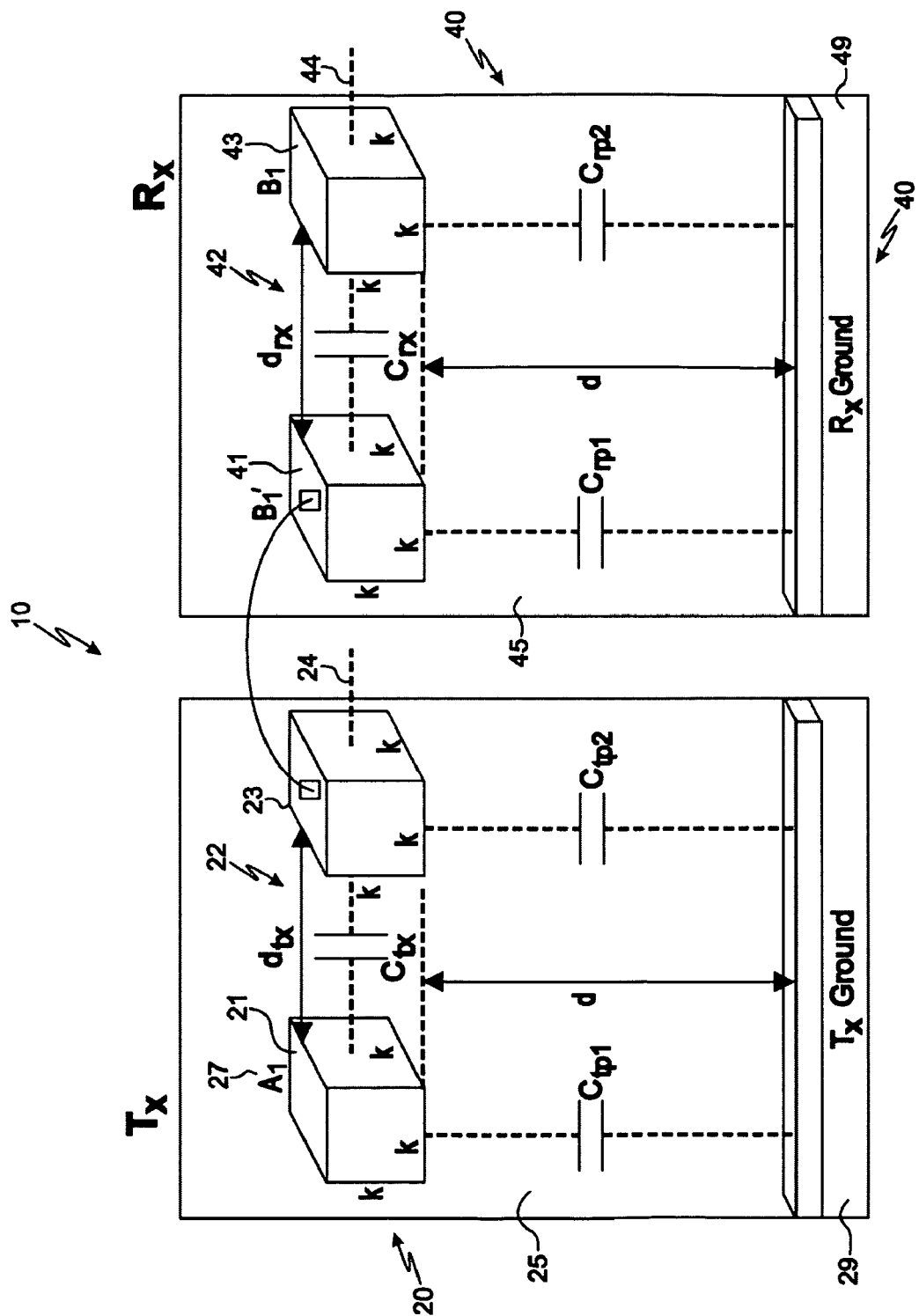
FIG. 2 shows a schematic embodiment of a high voltage isolation dual capacitor communication system with co-planar drive and sense electrodes disposed in a single plane.

FIG. 2 shows one such embodiment where first and second capacitors 22 and 42 are connected electrically in series, are disposed within transmitter 20 and receiver 40, respectively, and comprise drive electrodes 21 and 23 and sense electrodes 41 and 43 that are arranged in respective horizontal planes 24 and 44. As shown in FIG. 2, first capacitor 22 (or $C_{tx}$) is provided in transmitter 20 (or $T_x$) and second capacitor 42 (or $C_{rx}$) is provided in receiver 40 (or $R_x$). The overall capacitance of system 10 is shared between first capacitor 22 and second capacitor 42 which as shown each comprise at least two electrodes, drive electrodes 21 and 23 in first capacitor 22 and sense electrodes 41 and 43 in second capacitor 42. (Note that other numbers of drive and sense electrodes may also be employed, depending on the particular application at hand.) The parasitic capacitances between these electrodes or metal layers and ground planes 29 and 49 are represented by $C_{tp1}$, $C_{tp2}$, $C_{rp1}$ and $C_{rp2}$. The distance d shown in FIG. 2 is the distance from the bottom of each of first and second capacitors 22 and 42 to the substrate ground plane. The distance $d_{tx}$ represents the distance between drive electrodes 21 and 23 in the transmitter 20, while the distance $d_{rx}$ represents the distance between sense electrodes 41 and 43 in receiver 40. The top plates of first and second capacitors 22 and 42 are connected electrically by electrical connection 30, which in one embodiment is a bond wire.

In one embodiment, transmitter 20 and receiver 40 are incorporated into integrated circuits (ICs), and are then encapsulated or overmolded with a suitable packaging material. Transmitter 20 and receiver 40 have different ground potentials associated therewith, and thus first and second capacitors 22 and 42 form a galvanic isolator between the circuits 20 and 40. A combined high voltage isolation distance in system 10 is defined by the sum of $d_{tx}$ and $d_{rx}$. As a result, the high voltage isolation distances of the embodiments of system 10 illustrated in FIGS. 2 through 6 are not limited to a single capacitor distance of d. Moreover, a high voltage applied between transmitter node $A_1$ (or first node 27) and receiver node $B_1$ (or second node 47) is distributed and developed across both first capacitor 22 and second capacitor 42. Because breakdown voltage stresses are shared between two capacitors and two devices 20 and 40, the dual capacitor systems 10 illustrated in FIGS. 2 through 6 are capable of providing higher breakdown voltage levels than otherwise comparable single capacitor systems.

Continuing to refer to FIG. 2, the signal coupling efficiency between the transmitter node at $A_1$ (or first node 27) and the receiver node at $B_1$ (or second node 47) may be calculated as follows. The equivalent capacitance between node $B_{1'}$ and ground is given by:

$$C_{B1'} = C_{tp2} + C_{rp1} + (C_{rx} * C_{rp2})/(C_{rx} + C_{rp2}) \qquad \text{eq. (7)}$$

The coupling efficiency between node B1' and node A1 is defined by:

$$C_{\mathit{eff}}\text{-}B_{1'}/A_1 = C_{tx}/(C_{tx} + C_{B1'}) \qquad \text{eq. (8)}$$

The coupling efficiency between node $B_1$ and node $B_{1'}$ is determined by:

$$C_{\mathit{eff}}\text{-}B_1/B_{1'} = C_{rx}/(C_{rx} + C_{rp2}) \qquad \text{eq. (9)}$$

Combining equations (7) through (9) yields the coupling efficiency between nodes $A_1$ and $B_1$ as:

$$C_{\mathit{eff}}\text{-}B_1/A1 = C_{\mathit{eff}}\text{-}B_{1'}/A_1 * C_{\mathit{eff}}\text{-}B_1/B_{1'} = C_{tx} * C_{rx}/[(C_{tx} + C_{tp2} + C_{rp1}) * (C_{rx} + C_{rp2}) + C_{rx} * C_{rp2}] \qquad \text{eq. (10)}$$

Figure 3:
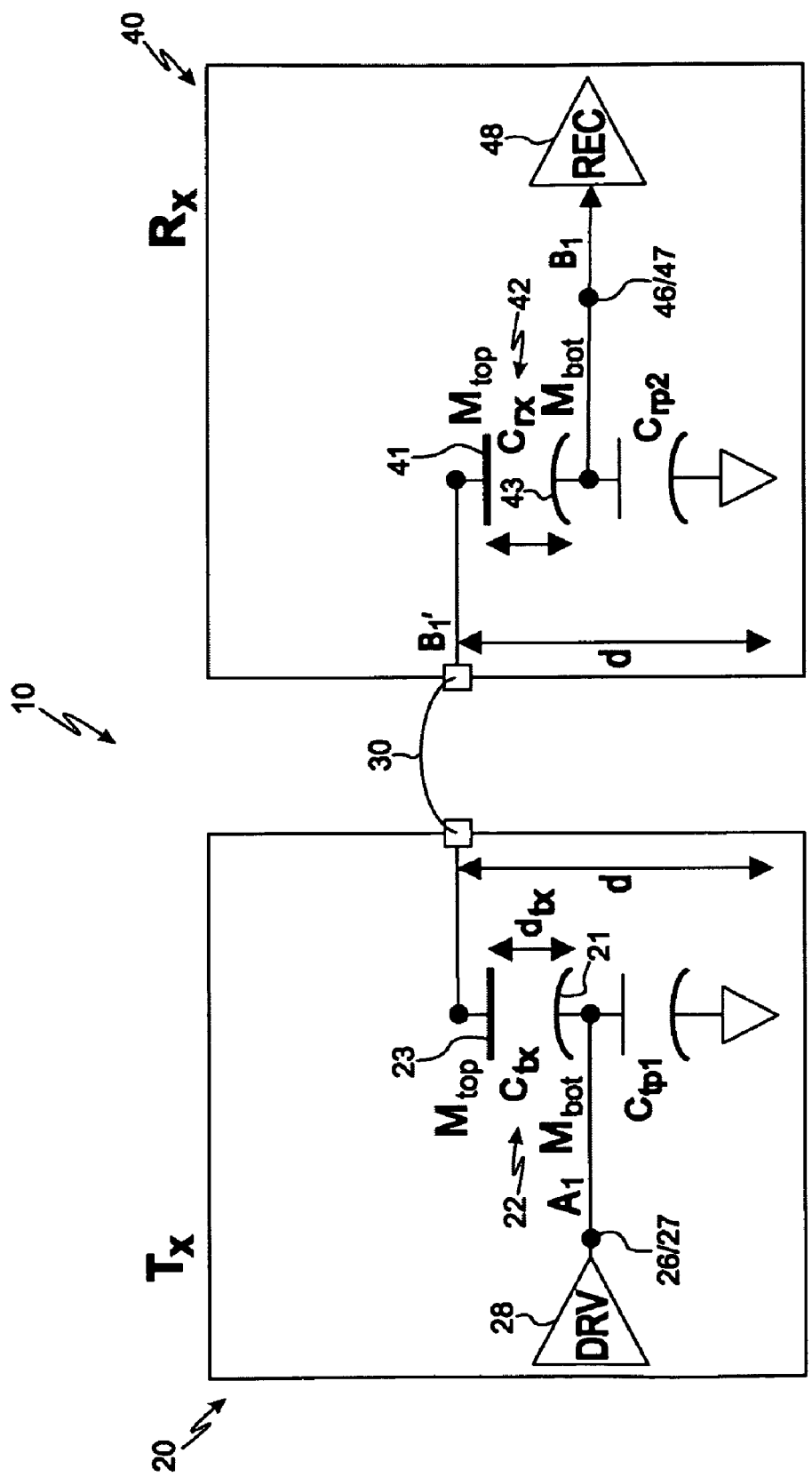
FIG. 3 shows a block diagram of one embodiment of a high voltage isolation dual capacitor communication system.
Figure 4:
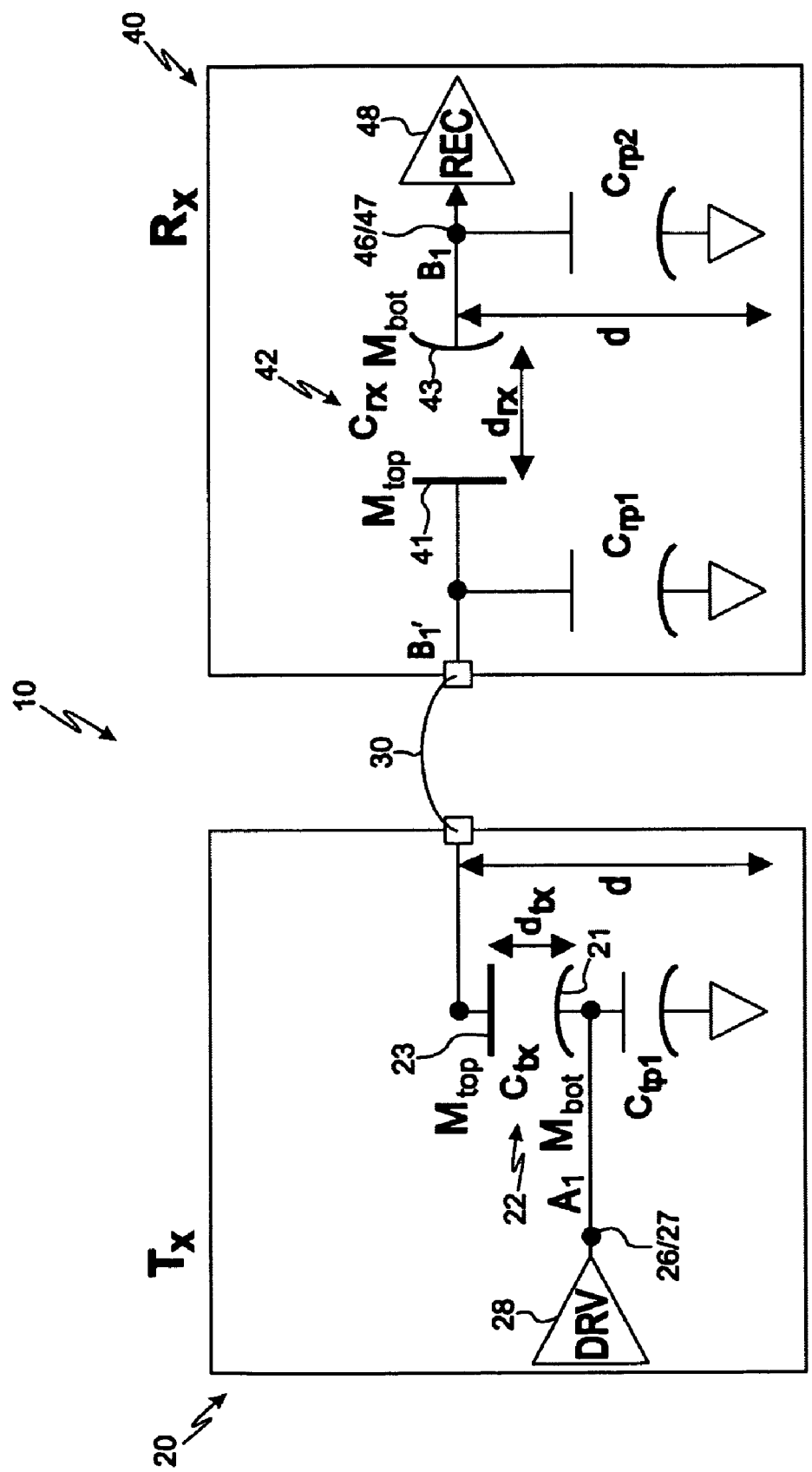
FIG. 4 shows a block diagram of another embodiment of a high voltage isolation dual capacitor communication system.
Figure 5:
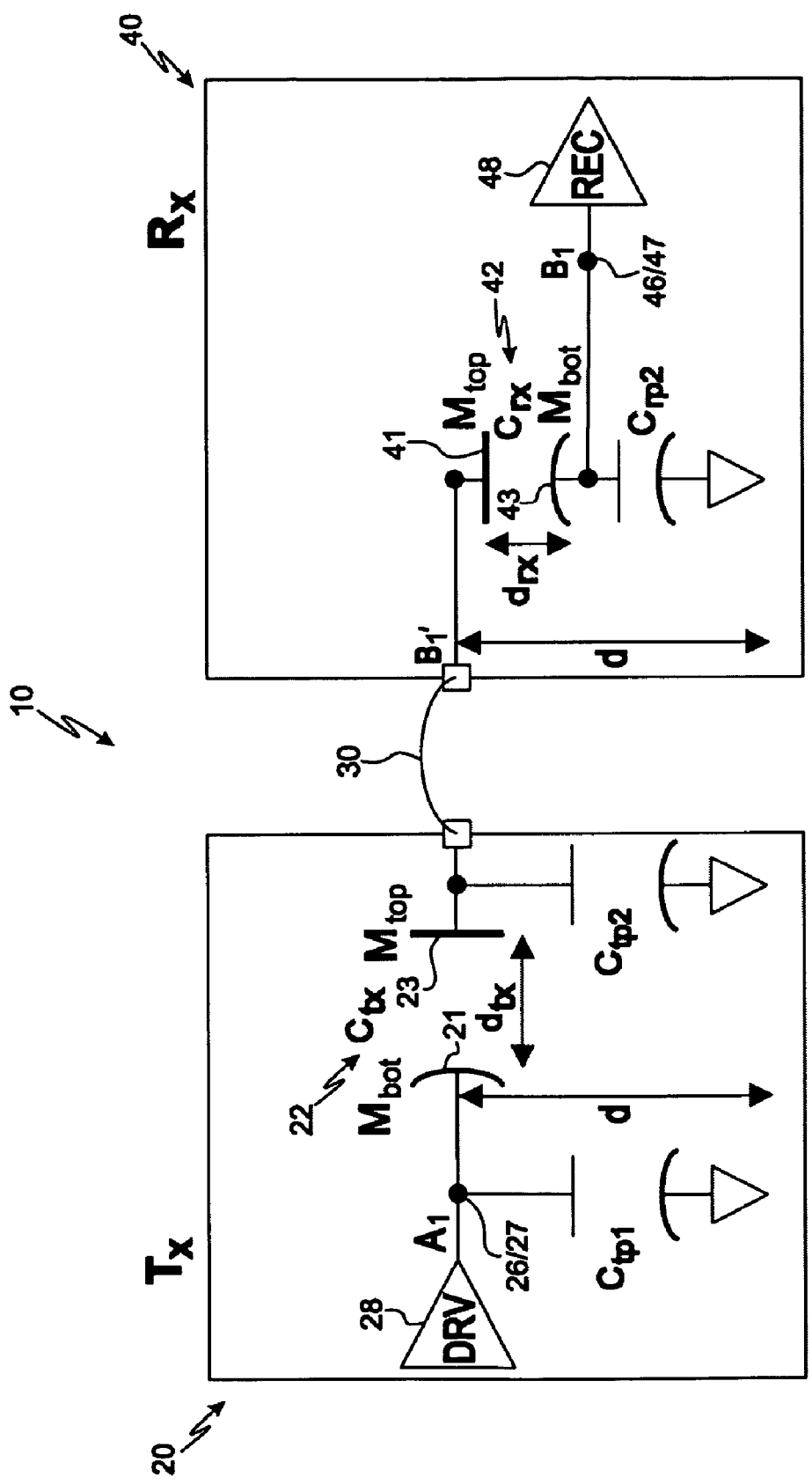
FIG. 5 shows a block diagram of yet another embodiment of a high voltage isolation dual capacitor communication system.
Figure 6:
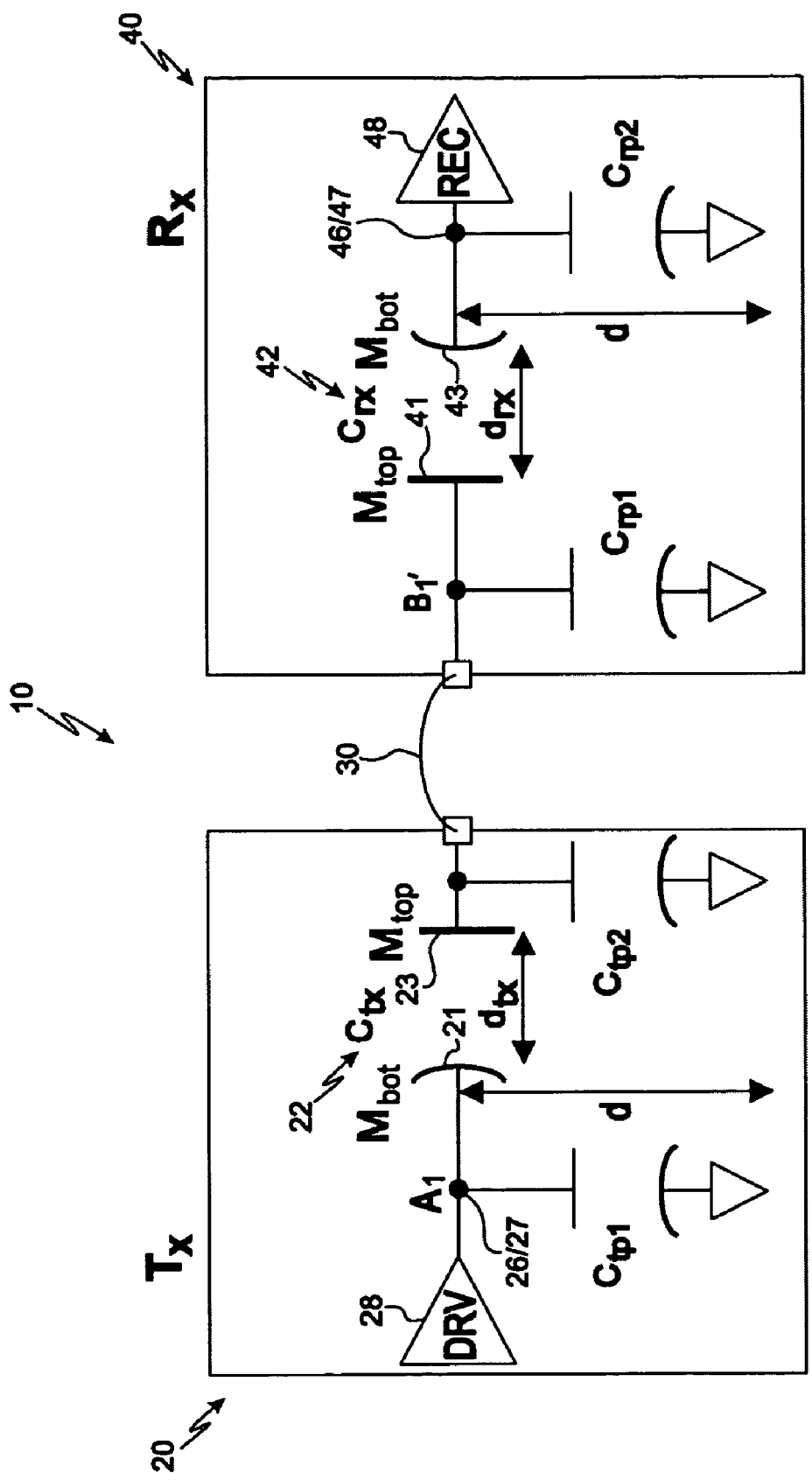
FIG. 6 shows a block diagram of still another embodiment of a high voltage isolation dual capacitor communication system.

Note that the electrodes of first capacitor 22 of transmitter 20 and second capacitor 42 of receiver 40 may be arranged vertically or stacked one atop the other, or may be arranged horizontally and co-planar in respect of one another. Consequently, four different configurations of drive and sense electrodes in dual capacitor system 10 may be provided:

(a) transmitter 20 having vertically-stacked drive electrodes 201 and 23, and receiver 40 having vertically-stacked sense electrodes 41 and 43 (see FIG. 3);

(b) transmitter 20 having vertically-stacked drive electrodes 21 and 23, and receiver 40 having horizontally-oriented co-planar sense electrodes 41 and 43 (see FIG. 4);

(c) transmitter 20 having horizontally-oriented co-planar drive electrodes 21 and 23, and receiver 40 having vertically-stacked sense electrodes 41 and 43 (see FIG. 5), and (d) transmitter 20 having horizontally-oriented co-planar drive electrodes 21 and 23, and receiver 40 having horizontally-oriented co-planar sense electrodes 41 and 43 (see FIG. 6).

Referring now to FIG. 3, there is shown an embodiment comprising transmitter 20 having vertically-stacked drive electrodes 21 and 23, and receiver 40 having vertically-stacked sense electrodes 41 and 43. To assess the signal coupling and voltage breakdown characteristics of system 10 illustrated in FIG. 3, the following calculations are performed. Substituting $C_{tp2}=0$ and $C_{rp1}=0$ into eq. (10) yields:

$$C_{eff}\text{-}B_1/A_1 = C_{tx}*C_{rx}/[C_{tx}*(C_{rx}+C_{rp2})+C_{rx}*C_{rp2}] \quad \text{eq. (11)}$$

From the above analysis of a single capacitor system, it has been determined that in a vertically stacked capacitor structure the optimum trade-off between high voltage breakdown level and coupling efficiency occurs when the inter-electrode distance equals d/2. In a co-planar horizontal capacitor structure, however, the optimum trade-off between high voltage breakdown level and coupling efficiency occurs when the inter-electrode distance equals d. Thus, the optimum high voltage isolation distance in the dual capacitor system 10 of FIG. 3 is given by:

$$D_{iso} = d_{tx} + d_{rx} = d/2 + d/2 = d \quad \text{eq. (12)}$$

To simplify analysis, it is assumed that the sense and drive electrodes are metal cubes having sides with dimensions k. If fringe capacitance is ignored, then the capacitances $C_{tx}$, $C_{tp1}$, $C_{rx}$ and $C_{rp2}$ are all equal to one another. As a result, Eq. (11) for the embodiment of system 10 shown in FIG. 3 may be simplified to:

$$C_{eff}\text{-}B_1/A_1 = 1/3 \quad \text{eq. (13)}$$

Referring now to FIG. 4, there is shown an embodiment comprising transmitter 20 having vertically-stacked drive electrodes 21 and 23, and receiver 40 having horizontally-oriented co-planar sense electrodes 41 and 43. To assess the signal coupling and voltage breakdown characteristics of system 10 illustrated in FIG. 4, the following calculations are performed. Substituting $C_{tp2}=0$ into eq. (10) yields.

$$C_{eff}\text{-}B_1/A_1 = C_{tx}*C_{rx}/[(C_{tx}+C_{rp1})*(C_{rx}+C_{rp2})+C_{rx}*C_{rp2}], \quad \text{eq. (14)}$$

Using the same type of analysis applied above in respect of FIG. 3, the optimum high voltage isolation distance in the dual capacitor system 10 of FIG. 4 is given by:

$$D_{iso} = d/2 + d = 1.5 \cdot d \quad \text{eq. (15)}$$

In the case presented by FIG. 4, $C_{tx}=C_{tp1}$, and $C_{rx}=C_{rp1}=C_{rp2}=1/2 \cdot C_{tx}$, and simplifying yields:

$$C_{eff}\text{-}B_1/A_1 = 2/7 \quad \text{eq. (16)}$$

Referring now to FIG. 5, there is shown an embodiment comprising transmitter 20 having horizontally-oriented co-planar drive electrodes 21 and 23, and receiver 40 having vertically-stacked sense electrodes 41 and 43. To assess the signal coupling and voltage breakdown characteristics of system 10 illustrated in FIG. 5, the following calculations are performed. Substituting $C_{rp1}=0$ into Eq. (10) yields:

$$C_{eff}\text{-}B_1/A_1 = C_{tx}*C_{rx}/[(C_{tx}+C_{tp2})*(C_{rx}+C_{rp2})+C_{rx}*C_{rp2}] \quad \text{eq. (17)}$$

The optimum high voltage isolation distance is given by:

$$D_{iso} = d + d/2 = 1.5 \cdot d \quad \text{eq. (18)}$$

In the case presented by FIG. 5, $C_{tx}=C_{tp1}=C_{tp2}$ and $C_{rx}=C_{rp2}=2 \cdot C_{tx}$, and simplifying yields:

$$C_{eff}\text{-}B_1/A_1 = 1/6 \quad \text{eq. (19)}$$

Referring now to FIG. 6, there is shown an embodiment comprising transmitter 20 having horizontally-oriented co-planar drive electrodes 21 and 23, and receiver 40 having horizontally-oriented co-planar sense electrodes 41 and 43. To assess the signal coupling and voltage breakdown characteristics of system 10 illustrated in FIG. 6, the following calculations are performed. The coupling efficiency is given by Eq. (10), which is repeated here for clarity:

$$C_{eff}\text{-}B_1/A_1 = C_{tx}*C_{rx}/[(C_{tx}+C_{tp2}+C_{rp1})*(C_{rx}+C_{rp2})+C_{rx}*C_{rp2}] \quad \text{eq. (20)}$$

The optimum high voltage isolation distance is given by:

$$D_{iso} = d + d = 2 \cdot d \quad \text{eq. (21)}$$

In the case presented by FIG. 6, $C_{tx}=C_{tp1}=C_{tp2}=C_{rx}=C_{rp1}=C_{rp2}$, and simplifying yields:

$$C_{eff}\text{-}B_1/A_1 = 1/7 \quad \text{eq. (22)}$$

It will now be seen that as between systems 10 presented in FIGS. 4 and 5, system 10 of FIG. 4 has a higher coupling efficiency than does system 10 of FIG. 5 for the same isolation distance. As between systems 10 presented in FIGS. 3 and 4, system 10 in FIG. 4 has 50% more isolation distance than that of system 10 in FIG. 3, while system 10 of FIG. 4 also has a coupling efficiency that is only 14% lower than system 10 of FIG. 3. As between systems 10 in FIGS. 4 and 6, although system 10 of FIG. 4 has an isolation distance that is 25% less than that of system 10 of FIG. 6, the coupling efficiency of system 10 in FIG. 4 is twice that of system 10 in FIG. 6. In conclusion, a comparison of the four different dual capacitor systems 10 of FIGS. 3 through 6 shows that the configuration illustrated in FIG. 4 presents an excellent compromise between isolation distance and coupling efficiency, and therefore represents a particularly preferred embodiment for galvanic isolation and high speed signal transfer applications.

Providing vertically-stacked electrodes 21 and 23 in transmitter 20 coupled to co-planar horizontal electrodes 41 and 43 in receiver 40 offers a few key advantages over the conventional method of employing only stacked vertical or co-planar horizontal electrodes in a high voltage isolation and signal transfer medium. For example, the high voltage breakdown performance of a dual capacitor structure is higher than that of a capacitor having vertically-stacked electrodes alone, or horizontally-oriented co-planar electrodes alone. A hybrid structure having vertically-stacked electrodes 21 and 23 in first capacitor 22 in transmitter 20 connected electrically in series with horizontally-oriented co-planar electrodes 41 and 43 in second capacitor 42 in receiver 40 ensures that high voltage breakdown performance and signal coupling efficiency are optimized.

The top plate of vertically-stacked drive electrodes 21 and 23 may also double as a bond pad so that wire or connection 30 can be bonded between electrode 23 of transmitter 20 and electrode 41 of receiver 40. Thus, no additional area or space need be consumed to implement combined vertically-stacked and horizontally-oriented co-planar dual capacitors.

In transmitter 20, the top metal layer of electrode 23 may be used as a top plate. For example, in a five-metal-layer process, the fifth layer may be used as the top plate. The bottom plate can then be any of the metal layers disposed below the top metal layer. For example, in a five-metal-layer process, any of metal layers 1, 2, 3 and 4 layer can be used as the bottom plate. The separation between the top and bottom plates then determines the vertical isolation distance. The parasitic capacitance from the bottom plate to the ground plane does not degrade signal transmission because the bottom plate is driven by the driver circuit of the transmitter, which is a low impedance node. The respective surface areas of the metal plates therefore determine the vertical capacitance or the coupling efficiency. This ensures that two key design parameters, namely high voltage breakdown performance and coupling efficiency, are de-coupled from one another with respect to design constraints and other considerations.

In receiver 40, co-planar second capacitor 42 may be constructed using only a top metal layer since parasitic capacitance is most significant between the top metal layer and the ground plane. Because the distance between the top metal layer and the ground plane is further than the distance between the bottom metal layer and the ground plane, the parasitic capacitor of the co-planar second capacitor 42 is effectively minimized. Having minimum parasitic capacitance on the receiver side of system 10 is important because input node 47 of receiver 20 is a high impedance node, which is sensitive to noise and parasitic loading.

In one embodiment, a first breakdown voltage between drive electrodes 21 and 23 and sense electrodes 41 and 43 exceeds about 2,000 volts RMS when applied over a time period of about one minute, exceeds about 2,500 volts RMS when applied over a time period of about one minute, exceeds about 3,000 volts RMS when applied over a time period of about one minute, exceeds about 4,000 volts RMS when applied over a time period of about one minute, exceeds about 5,000 volts RMS when applied over a time period of about one minute, or exceeds about 6,000 volts RMS when applied over a time period of about one minute.

The first breakdown voltage may also be greater than or equal to a second breakdown voltage between drive electrodes 21 and 23 and ground plane 29, or between sense electrodes 41 and 43 and ground plane 49. According to UL (UNDERWRITERS LABORATORIES™) Standard 1577, the primary test of a device's insulation performance or capability is the device's ability to withstand the application of high voltages without breaking down. In the test specified in UL 1577, a test is performed where a voltage (ac RMS or DC) is applied between the input and output terminals of a device for one minute. Voltage ratings ranging between about 2,500 $V_{rms}$ and about 5,000 $V_{rms}$ are highly desirable under such test conditions.

Drive and sense electrodes 21, 23, 41 and 43 are preferably formed of an electrically conductive metal, a metal alloy or a metal mixture. The metals, metal alloys or metal mixtures employed to form drive and sense electrodes 21, 23, 41 and 43 may be the same, or may be different from one another, and may comprise any one or more of gold, silver, copper, tungsten, tin, aluminium, and aluminium-copper. In a preferred embodiment, drive electrodes 21 and 23, and sense or receive electrodes 41 and 43, are formed using CMOS metal deposition techniques well known to those skilled in the art, and inter-electrode spacings dtx and drx are provided by controllably etching away metal between adjoining electrodes using, for example, a high density plasma etching technique, and then filling the space defined by inter-electrode spacings dtx and drx with one or more of a semiconductor dielectric material, silicon oxide, silicon nitride, and/or a thick oxide. Care must be taken that voids in the semiconductor dielectric material are not formed, and that the metal layers are etched out anisotropically during the etching process. Well known High Density Plasma ("HDP"), Tetraethylorthosilicate ("TEOS"), and Plasma Enhanced Silicon Nitride ("PESN") passivation techniques may also be employed advantageously when fabricating system 10.

Electrically insulative layers 25 and 45 may be formed using conventional CMOS techniques and materials such as one or more of a semiconductor dielectric material, silicon oxide, silicon nitride, and/or a thick oxide. Underlying ground planes 29 and 49 are also preferably formed using well-known CMOS techniques, are electrically conductive, and in one embodiment are formed of a semiconductor dielectric material such as silicon.

Note that the various embodiments are not restricted to CMOS techniques. Instead, other techniques are also contemplated, such as Bipolar-CMOS processes, combined Bipolar-CMOS-DMOS (BCD) processes, and indeed any other suitable semiconductor fabrication technique that may be employed to form electrodes 21, 23, 41 and 43, insulative layers 25 and 45, and ground planes 29 and 49. Note also that devices 20 and 40, and system 10 may be encapsulated at least partially in polyimide, plastic or any other suitable packaging or molding material.

Figure 7:
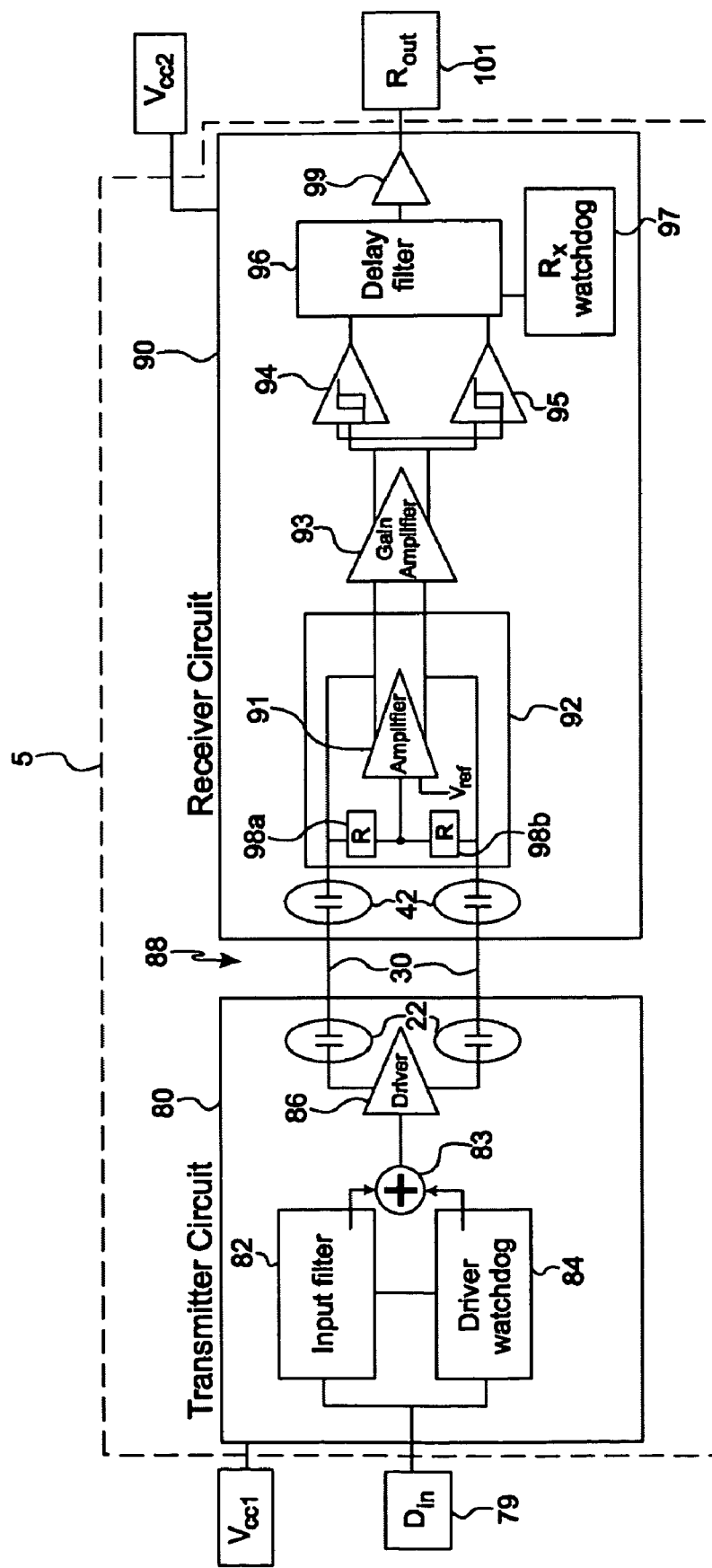
FIG. 7 shows one embodiment of a functional block diagram for driver and receiver circuits in a high voltage isolation semiconductor communication device.

FIG. 7 shows one embodiment of a functional block diagram for transmitter and receiver circuits 80 and 90 associated with transmitter 20 and receiver 40 in high voltage isolation dual capacitor communication system 10. In FIG. 7, input communication signals are provided to input $D_{in}$ 79 of driver circuit 80, where they are filtered by input filter circuit 82, summed according to an output provided by driver watchdog 84, and transmitted through first capacitors 22 across boundary 88 through wirebonds 30 to second capacitors 42. Driver circuit 86 effects the transmission of communication signals across boundary 88 to receiver circuit 90. The output provided by CMR circuit 92 is routed to gain amplifier circuit 93, which provides outputs to comparator/RS flip-flops 94 and 95, whose outputs in turn are routed to delay filter circuit 96. A final output signal from receiver circuit 90 is provided by output buffer 99 at $R_{out}$ 101.

In the embodiment shown in FIG. 7, driver circuit 80 and receiver circuit 90 operate in a fully differential configuration, which has the advantage of rejecting undesirable common mode signals such as noise that may be present in the signal path. The embodiment shown in FIG. 7 achieves high common mode rejection performance. Input signals originating at driver circuit 80 are transmitted across isolation boundary 88 (which from a functional perspective includes electrically insulative material disposed between adjoining drive and sense electrodes, not shown explicitly in FIG. 7) as signal transitions, which in a preferred embodiment are transmitted fully differentially through first capacitor 22 and decoded by receiver circuit 90. Fully differential signals received by sense electrodes in second capacitor 42 are routed through common mode rejection ("CMR") circuit 92 through CMR resistors 98a and 98b. In the embodiment illustrated in FIG. 7, CMR circuit 92 regulates the common mode level of the fully differential inputs from capacitors 22 and 42. Note, however, that the invention includes within its scope embodiments not having CMR circuit 92 or not having fully differential inputs provided thereto.

Note that some embodiments do not require a separate data refresh capacitor circuit. Receiver circuit 90 shown in FIG. 7 may also be configured to correctly decode signals received from driver circuit 80 and provide faithfully and highly accurately reproduced versions of input signals provided to input 79 at output 101.

Figure 8:
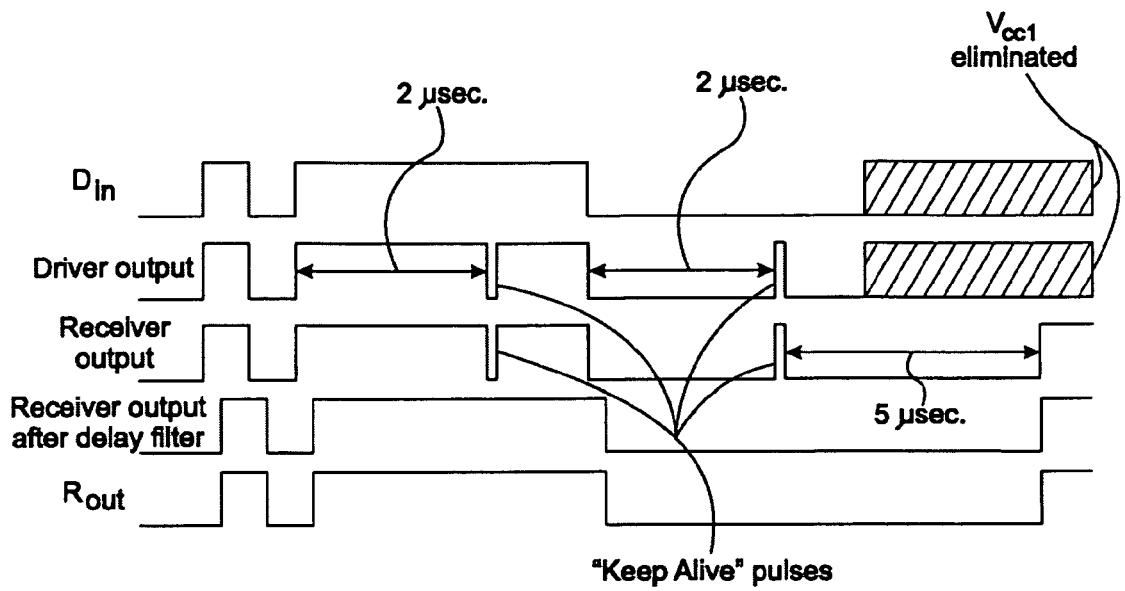
FIG. 8 shows waveforms produced by the circuits of FIG. 7 when a data-out signal defaults to a high state.
Figure 9:
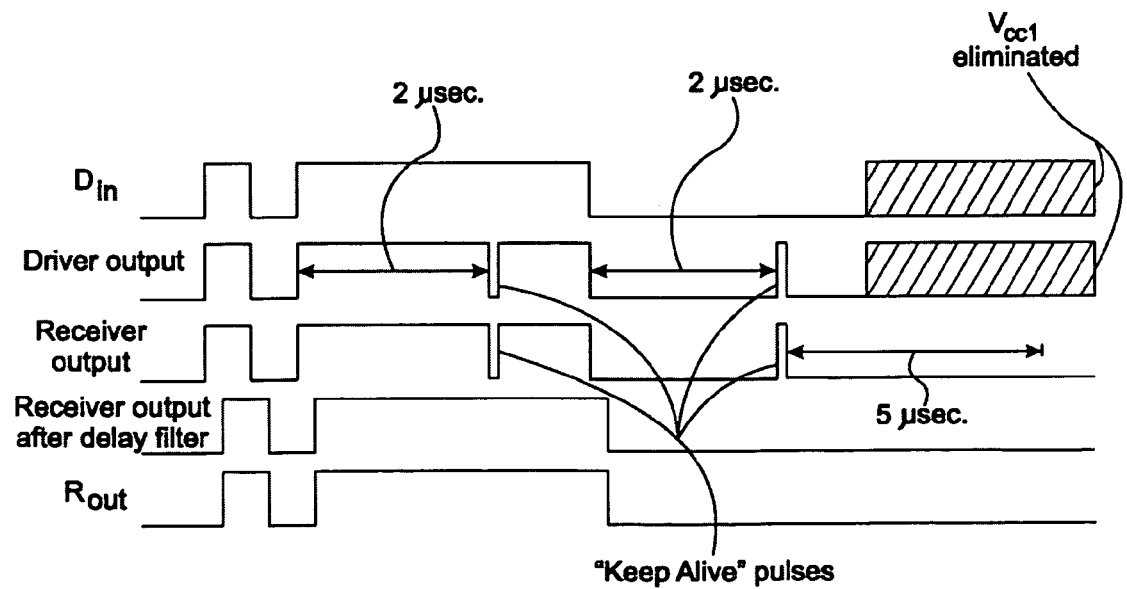
FIG. 9 shows waveforms produced by the circuits of FIG. 7 when a data-out signal defaults to a low state.

FIG. 8 shows waveforms produced by circuits 80 and 90 of FIG. 7 when a data-out signal defaults to a high state, while FIG. 9 shows waveforms produced by circuits 80 and 90 of FIG. 7 when a data-out signal defaults to a low state. Referring now to FIGS. 7 through 9, output comparator/RS flip-flops 94 and 95 are set and reset according to outputs provided by circuit 93. Driver circuit 86 is operably connected to driver watchdog circuit 84, which is configured to transmit pulses to receiver circuit 90 to maintain signals transmitted across boundary 88, which properly maintains the DC state of receiver circuit 90 in respect of signals received thereby. In the embodiment illustrated in FIG. 7, if a DC state in receiver circuit 90 is to be maintained longer than about 2 μsec. a "keep alive" pulse is transmitted from driver watchdog circuit 84 of driver circuit 80 to receiver circuit 90. As illustrated in FIGS. 8 and 9, the output provided by receiver circuit 90 at R$_{out}$ 101 defaults to a high or a low state after 5 μsec. when driver circuit 80 is no longer powered up and in consequence "keep alive" pulses are no longer received by receiver circuit 90 from driver circuit 80.

Continuing to refer to FIGS. 7 through 9, it will be seen that the transmit function of driver circuit 80 is effected by input filter circuit 82, summation block circuit 83, driver watchdog circuit 84 and single-to-differential driver circuit 86. Input filter circuit 82 is employed to ensure a pulse having a minimum width of 3 nanoseconds is filtered so as not to confuse the state machine of receiver circuit 90. The single ended to differential conversion effected by driver circuit 86 is preferably implemented with minimal skew. In addition to sending "keep alive" pulses to receiver circuit 90, driver watchdog circuit 84 may also be employed to monitor incoming data signals.

Data transmitted across boundary 88 from driver circuit 80 are differentiated when received by gain amplifier 93. Differentiation occurs due to the transmission and reception characteristics of drive and sense electrodes 21, 23, 41 and 43 (not shown in FIG. 7) in capacitors 22 and 42, as well as those of receiver common mode resistors 98a and 98b. The amplitudes of signals initially received by receiver circuit 90 are set by the ratios of first and second capacitors 22 and 42, and the respective parasitic capacitances associated therewith. The receiver circuit's input common mode is established by CMR circuit 92. In normal operation, CMR circuit 92 drives zero current into common mode resistors 98a and 98b. During a CMR event, large common mode currents are pushed or pulled into the output terminals of amplifier 91. Large dV/dT currents are created by dual capacitors 22 and 42 in conjunction with changing ground potential differences arising between driver circuit 80 and receiver circuit 90, which in a preferred embodiment each comprise separate integrated circuits (ICs). To maintain a proper common mode voltage at the input terminals of amplifier 91, amplifier 91 must apply a compensating current to CMR resistors 98a and 98b.

Note that without CMR circuit 924 some CMR events would drive the voltage at the sense electrodes of the receiver circuit 90 to ground or V$_{DD}$. In such a scenario, the sense electrodes could be clamped by diodes, for example, connected to the backsides of coupling capacitors 42. The clamped inputs would result in all data being lost.

In one embodiment, CMR circuit 92 is designed to compensate for CMR events characterized by values less than or equal to 25 kV/μsec., which may be accomplished by forcing current into or away from the receiver inputs. As a result, receiver circuit 90 may be configured to recover data in the presence of CMR events which do not exceed 25 kV/μsec. CMR events that exceed such a threshold may result in data loss or errors. In some embodiments, data communication rates achieved by system 104 where digital data are transferred by capacitive means between driver circuit 80 and receiver circuit 90, may range up to or even exceed about 300 Megabits per second.

It will now become apparent to those skilled in the art that the various embodiments of the invention disclosed herein provide several advantages, including, but not limited to providing improved circuit performance, smaller packages or chips, lower power consumption, and faster data transmission rates.

Note that the terms "vertical" and "horizontal" employed herein are intended to refer to the relative orientations of capacitor planes as they relate to underlying or overlying ground planes 29 and 49. Thus, while a device made in accordance with the teachings of the invention might, in fact, have co-planar digital data communication electrodes disposed in a single plane, and the single plane is vertically oriented but is parallel or substantially parallel to the ground plane substrate, such a device would nevertheless fall within the scope of the invention.

Note further that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A high voltage isolation dual capacitor communication system, comprising:
    a transmitter having a first capacitor comprising at least first and second communication drive electrodes separated by a distance d$_{tx}$ and disposed in at least a first electrically conductive metallized layer, the first and second drive electrodes having a first capacitance C$_{tx}$ therebetween, a first electrically conductive ground plane being spaced vertically apart from the first and second drive electrodes by a first electrically insulative layer, the first drive electrode being operably coupled to a drive input through a first node, a drive circuit being operably coupled to the drive input and configured to transmit a communication drive signal through the first capacitor;
    a receiver having a second capacitor comprising at least first and second communication sense electrodes separated by a distance d$_{rx}$ and disposed in at least a second electrically conductive metallized layer, the first and second sense electrodes having a second capacitance C$_{rx}$ therebetween, a second electrically conductive ground plane being spaced vertically apart from the first and second sense electrodes by a second electrically insulative layer, the second sense electrode being operably coupled to a sense output through a second node, a receive circuit being operably coupled to the sense output and configured to receive the communication drive signal received by the second capacitor;
    wherein the first and second capacitors of the transmitter and receiver, respectively, are connected electrically in series to permit the transfer of the communication drive signal through an electrical connection disposed therebetween, the first and second capacitors are configured to provide galvanic isolation between the transmitter and the receiver, a high voltage isolation distance of the system is defined by a sum of the distances d$_{tx}$ and d$_{rx}$, and a voltage developed between the first node and the second node is shared and distributed between the first and second capacitors.

2. The system of claim 1, wherein the first and second drive electrodes are vertically stacked, the first drive electrode is disposed below the second drive electrode, and the first electrically conductive ground plane is disposed beneath the first and second drive electrodes.

3. The system of claim 1, wherein the first and second sense electrodes are co-planar and disposed horizontally within the same plane, and the second electrically conductive ground plane is disposed beneath the first and second sense electrodes.

4. The system of claim 1, wherein the first and second sense electrodes are vertically stacked, the first sense electrode is disposed above the second sense electrode, and the second electrically conductive ground plane is disposed beneath the first and second sense electrodes.

5. The system of claim 1, wherein the first and second drive electrodes are co-planar and disposed horizontally within the same plane, and the first electrically conductive ground plane is disposed beneath the first and second drive electrodes.

6. The system of claim 1, wherein the system has a breakdown voltage exceeding about 3,000 volts RMS when applied over a time period of about one minute.

7. The system of claim 1, wherein the system has a breakdown voltage exceeding about 4,000 volts RMS when applied over a time period of about one minute.

8. The system of claim 1, wherein the system has a breakdown voltage exceeding about 6,000 volts RMS when applied over a time period of about one minute.

9. The system of claim 1, wherein the second drive electrode is operably coupled to the first sense electrode to provide the series electrical connection between the first and second capacitors.

10. The system of claim 1, wherein the transmitter comprises an integrated circuit (IC), and the receiver comprises an IC.

11. The system of claim 10, wherein the transmitter and receiver ICs are encapsulated or overmolded to form a single package.

12. The system of claim 1, wherein the first electrically conductive metallized layer includes a first bond pad configured to have a first end of the electrical connection wirebonded thereto.

13. The system of claim 1, wherein the second electrically conductive metallized layer includes a second bond pad configured to have a second end of the electrical connection wirebonded thereto.

14. The system of claim 1, wherein the receiver and the transmitter are connected electrically to separate respective grounds.

15. The system of claim 1, wherein at least one of the first and second metallized layers comprise one or more of gold, silver, copper, tungsten, tin, aluminium, and aluminium-copper.

16. The system of claim 1, wherein at least one of the first and second electrically insulative layers comprises one or more of a semiconductor dielectric material, silicon oxide, silicon nitride and thick oxide.

17. The system of claim 1, wherein at least one of the first and second electrically conductive ground planes is formed of a semiconductor dielectric material or silicon.

18. The system of claim 1, wherein the transmitter is configured to transmit differential signals therethrough.

19. The system of claim 1, wherein the receiver is configured to receive differential signals therethrough.

20. The system of claim 1, wherein when a voltage ranging between about 2,000 volts RMS and about 6,000 volts RMS is placed across the first and second capacitors, the electric field densities resulting therein do not exceed about 400 volts/micron.

21. The system of claim 1, wherein at least portions of the transmitter or the receiver are fabricated using one or more of a CMOS process, a Bipolar-CMOS process, and a combined Bipolar-CMOS-DMOS (BCD) process.

22. The system of claim 1, wherein the system is encapsulated at least partially in polyimide or plastic.

23. The system of claim 1, wherein the receive circuit further comprises a common mode rejection (CMR) circuit.

24. The system of claim 1, wherein the system is configured to transfer data between the drive and receive circuits at a rate of up to about 300 Megabits per second.

25. A method of making a high voltage isolation dual capacitor communication system, comprising:
providing a transmitter having a first capacitor comprising at least first and second communication drive electrodes separated by a distance $d_{tx}$ and disposed in at least a first electrically conductive metallized layer, the first and second drive electrodes having a first capacitance $C_{tx}$ therebetween, a first electrically conductive ground plane being spaced vertically apart from the first and second drive electrodes by a first electrically insulative layer, the first drive electrode being operably coupled to a drive input through a first node, a drive circuit being operably coupled to the drive input and configured to transmit a communication drive signal through the first capacitor, and
providing a receiver having a second capacitor comprising at least first and second communication sense electrodes separated by a distance $d_{rx}$ and disposed in at least a second electrically conductive metallized layer, the first and second sense electrodes having a second capacitance $C_{rx}$ therebetween, a second electrically conductive ground plane being spaced vertically apart from the first and second sense electrodes by a second electrically insulative layer, the second sense electrode being operably coupled to a sense output through a second node, a receive circuit being operably coupled to the sense output and configured to receive the communication drive signal received by the second capacitor;
wherein the first and second capacitors of the transmitter and receiver, respectively, are connected electrically in series to permit the transfer of the communication drive signal through an electrical connection disposed therebetween, the first and second capacitors are configured to provide galvanic isolation between the transmitter and the receiver, a high voltage isolation distance of the system is defined by a sum of the distances $d_{tx}$ and $d_{rx}$, and a voltage developed between the first node and the second node is shared and distributed between the first and second capacitors.

26. The method of claim 25, wherein the first and second drive electrodes are vertically stacked, the first drive electrode is disposed below the second drive electrode, and the first electrically conductive ground plane is disposed beneath the first and second drive electrodes.

27. The method of claim 25, wherein the first and second sense electrodes are coplanar and disposed horizontally with the same plane, and the second electrically conductive ground plane is disposed beneath the first and second sense electrodes.

28. The method of claim 25, wherein the first and second sense electrodes are vertically stacked, the first sense electrode is disposed above the second sense electrode, and the second electrically conductive ground plane is disposed beneath the first and second sense electrodes.

29. The method of claim 25, wherein the first and second drive electrodes are co-planar and disposed horizontally with the same plane, and the first electrically conductive ground plane is disposed beneath the first and second drive electrodes.

30. The method of claim 25, wherein the transmitter and receiver are incorporated into integrated circuits (ICs), and the ICs are at least partially encapsulated or overmolded to form a single package.

* * * * *